US012756362B2

(12) United States Patent
Chao et al.

(10) Patent No.: US 12,756,362 B2
(45) Date of Patent: Oct. 6, 2026

(54) POWER AMPLIFIER

(71) Applicant: Himax Technologies Limited, Tainan City (TW)

(72) Inventors: Shin-Wei Chao, Tainan City (TW); Hsiang-Hsu Lai, Tainan City (TW); Hsiang-Yi Wu, Tainan City (TW)

(73) Assignee: Himax Technologies Limited, Tainan City (TW)

( * ) Notice: Subject to any disclaimer, the term of this patent is extended or adjusted under 35 U.S.C. 154(b) by 434 days.

(21) Appl. No.: 18/614,600

(22) Filed: Mar. 22, 2024

(65) Prior Publication Data

US 2025/0300603 A1 Sep. 25, 2025

(51) Int. Cl.
*H03F 1/02* (2006.01)
*H03F 3/213* (2006.01)

(52) U.S. Cl.
CPC .......... *H03F 1/0227* (2013.01); *H03F 3/213* (2013.01); *H03F 2200/471* (2013.01)

(58) Field of Classification Search
CPC .. H03F 1/0227; H03F 3/213; H03F 2200/471; H03F 3/21; H03F 3/165; H02M 1/0022; H02M 3/156
USPC ................................ 330/297, 279, 127, 129
See application file for complete search history.

(56) References Cited

U.S. PATENT DOCUMENTS

| | | | | |
|---|---|---|---|---|
| 8,981,847 | B2 * | 3/2015 | Balteanu ................ | H03F 3/193 330/297 |
| 11,264,955 | B2 * | 3/2022 | Ogura .................. | H03F 3/3022 |
| 2016/0065139 | A1 * | 3/2016 | Lee ........................ | H03F 3/211 330/297 |

* cited by examiner

*Primary Examiner* — Andrea Lindgren Baltzell
*Assistant Examiner* — Malane Lieng
(74) *Attorney, Agent, or Firm* — Donald E. Stout; Stout, Uxa & Buyan, LLP

(57) ABSTRACT

A power amplifier includes a voltage converter that converts an input voltage to a converted voltage; an output circuit coupled to receive the converted voltage and configured to generate an output voltage at an output node; a discharge transistor electrically connected between the output node and earth and configured to perform discharge at the output node under control of a control voltage; a voltage tracking circuit that tracks the input voltage; and an electric charge storage circuit being under control of the voltage tracking circuit and configured to maintain the control voltage when the input voltage drops to a predetermined voltage level in order to continuously turn on the discharge transistor before completing discharge at the output node.

14 Claims, 8 Drawing Sheets

200

POWER AMPLIFIER

BACKGROUND OF THE INVENTION

1. Field of the Invention

The present invention generally relates to a power amplifier, and more particularly to a discharge circuit of a power amplifier.

2. Description of Related Art

A power management integrated circuit (PMIC) is a type of integrated circuit that is used to manage power in a system. It is commonly used in devices that operate on battery power, such as mobile phones or portable media players. PMICs are designed to control the flow and direction of power to various parts of the system, including the selection and distribution of power from multiple sources, charging of internal batteries, and voltage regulation.

Power amplifiers adopted in the conventional PMIC suffer incomplete discharge at the output node when the input voltage drops. Conventional solutions cannot effectively solve this problem, so that the channel output may not be completely discharged to zero potential. Moreover, the solutions also add a lot of design cost and affect the efficiency, for example, by using high-voltage components.

A need has thus arisen to propose a novel scheme to overcome the drawbacks of the conventional power amplifiers.

SUMMARY OF THE INVENTION

In view of the foregoing, it is an object of the embodiment of the present invention to provide a power amplifier adaptable to power management integrated circuits with a discharge circuit capable of automatic voltage tracking and electric charge storage, thereby effectively improving power efficiency and reducing costs.

According to one embodiment, a power amplifier includes a voltage converter, an output circuit, a discharge transistor, a voltage tracking circuit and an electric charge storage circuit. The voltage converter converts an input voltage to a converted voltage. The output circuit is coupled to receive the converted voltage and configured to generate an output voltage at an output node. The discharge transistor is electrically connected between the output node and earth and configured to perform discharge at the output node under control of a control voltage. The voltage tracking circuit tracks the input voltage. The electric charge storage circuit is under control of the voltage tracking circuit and configured to maintain the control voltage when the input voltage drops to a predetermined voltage level in order to continuously turn on the discharge transistor before completing discharge at the output node.

DETAILED DESCRIPTION OF THE INVENTION

Figure 1A:
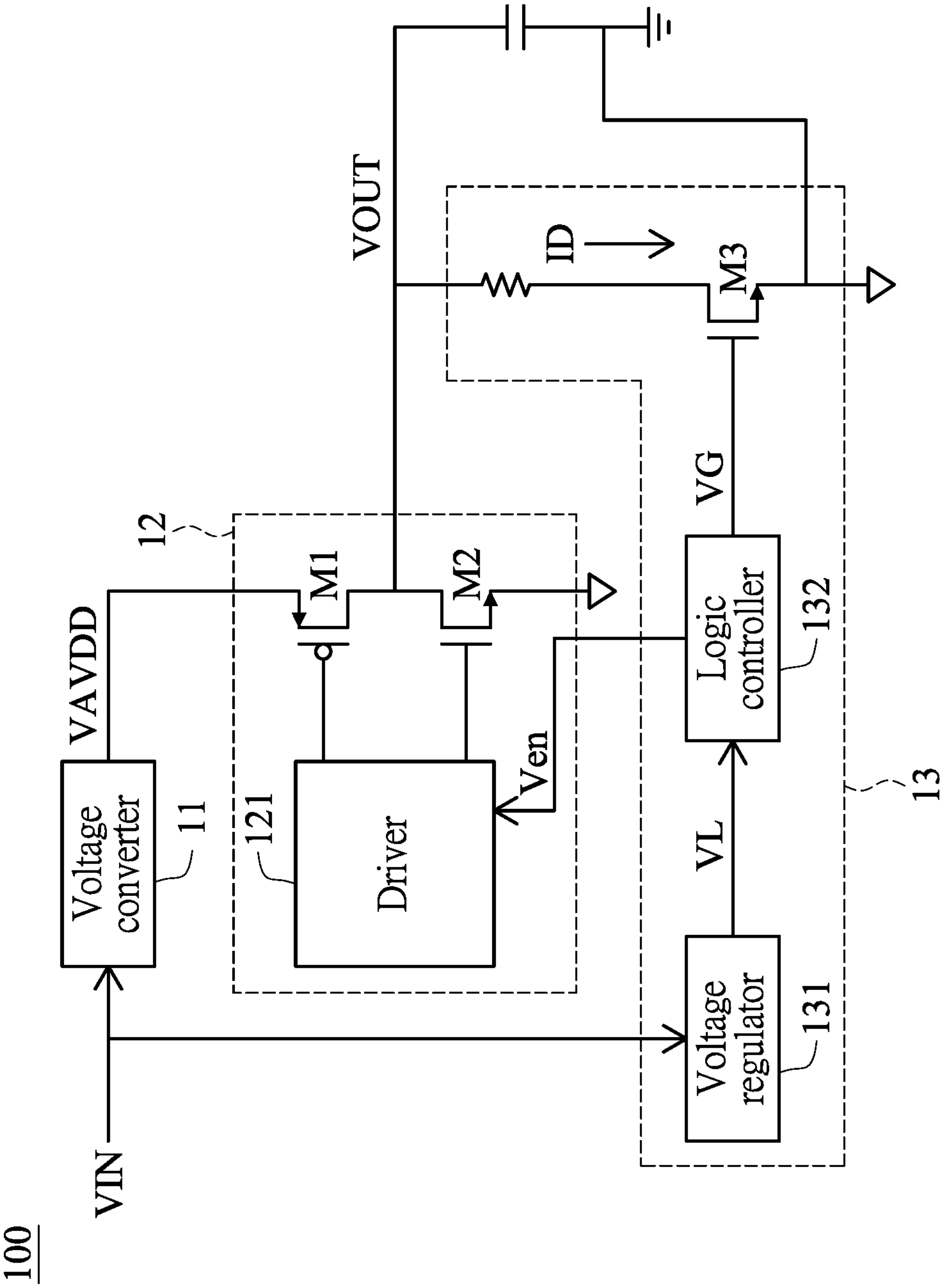
FIG. 1A shows a block diagram illustrating a power amplifier adaptable to power management integrated circuits.
Figure 1C:
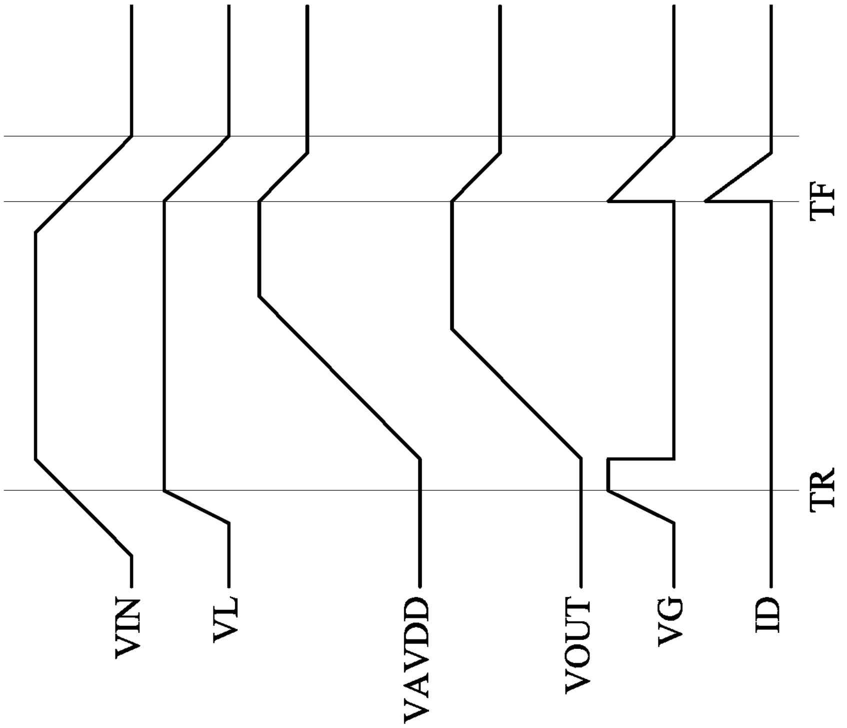
FIG. 1B and FIG. 1C show timing diagrams of pertinent signals of the power amplifier of FIG. 1A.
Figure 1B:
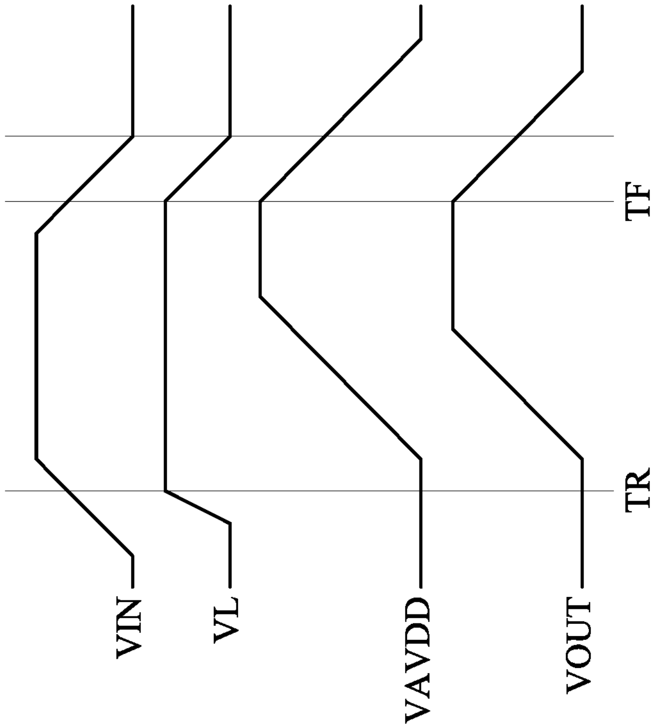

FIG. 1A shows a block diagram illustrating a power amplifier 100 adaptable to power management integrated circuits, and FIG. 1B shows timing diagrams of pertinent signals of the power amplifier 100 of FIG. 1A.

The power amplifier 100 may include a voltage converter 11 configured to convert an input voltage VIN to a converted voltage VAVDD. In one example, the voltage converter 11 may include a (high-voltage) boost converter.

The power amplifier 100 may include an output circuit 12 coupled to receive the converted voltage VAVDD and configured to generate an output voltage VOUT at an output node (of the power amplifier 100). Specifically, the output circuit 12 may include an output stage composed of a first transistor M1 and a second transistor M2 (with a type opposite to the first transistor M1) connected in series between the converted voltage VAVDD and earth, and interconnected at the output node VOUT. For example, the first transistor M1 may be a p-type metal-oxide-semiconductor field-effect transistor (MOSFET) and the second transistor M2 may be an n-type MOSFET. The first transistor M1 has a source coupled to receive the converted voltage VAVDD, and a drain connected to the output node. The second transistor M2 has a drain connected to the output node, and a source connected to the earth. The output circuit 12 may include a driver 121 configured to control (gates of) the first transistor M1 and the second transistor M2.

The power amplifier 100 may include a discharge circuit 13 coupled to receive the input voltage VIN and configured to perform discharge at the output node VOUT. As shown in FIG. 1B, when the input voltage VIN drops to a predetermined voltage level at time TF (also called input voltage VIN falling trigger time), discharge is performed to lower the output voltage VOUT toward zero voltage. Specifically, the discharge circuit 13 may include an (internal) voltage regulator 131, such as a low-dropout (LDO) regulator, coupled to receive the input voltage VIN and configured to generate a regulated voltage VL. The discharge circuit 13 may include a discharge transistor M3 (e.g., n-type MOSFET) electrically connected between the output node VOUT and the earth. For example, the discharge transistor M3 has a drain electrically connected to the output node (for example, via a resistor), a gate coupled to receive the control voltage VG, and a source electrically connected to the earth. The discharge circuit 13 may include a logic controller 132 coupled to receive the regulated voltage VL and configured to generate a control voltage VG used to control (gate of) the discharge transistor M3.

As shown in FIG. 1C exemplifying timing diagrams of pertinent signals of the power amplifier 100 of FIG. 1A, it is not unusual that, when the input voltage VIN drops, the control voltage VG may approach zero voltage before completing the discharge at the output node VOUT.

Figure 2A:
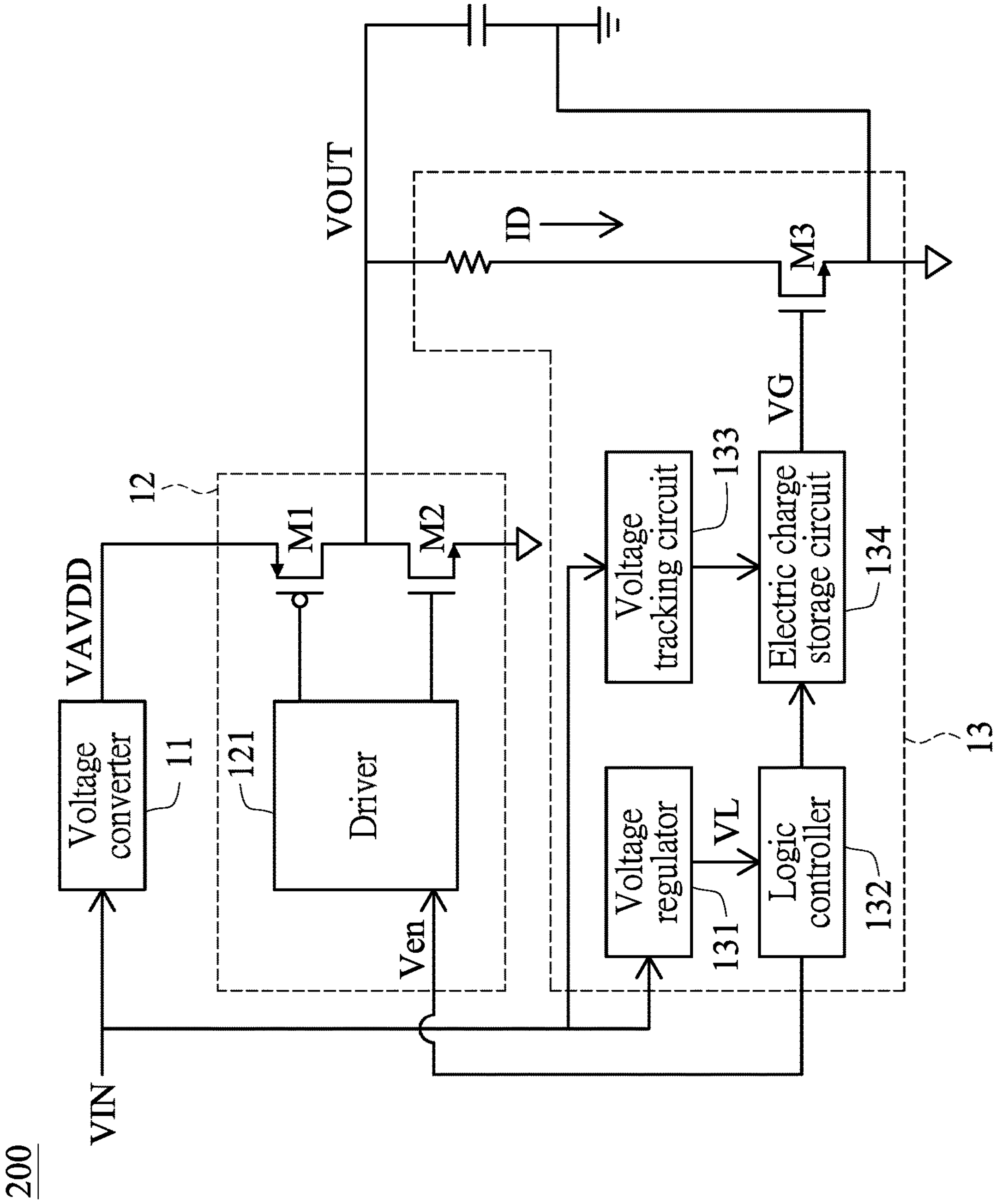
FIG. 2A shows a block diagram illustrating a power amplifier adaptable to power management integrated circuits according to one embodiment of the present invention.
Figure 2B:
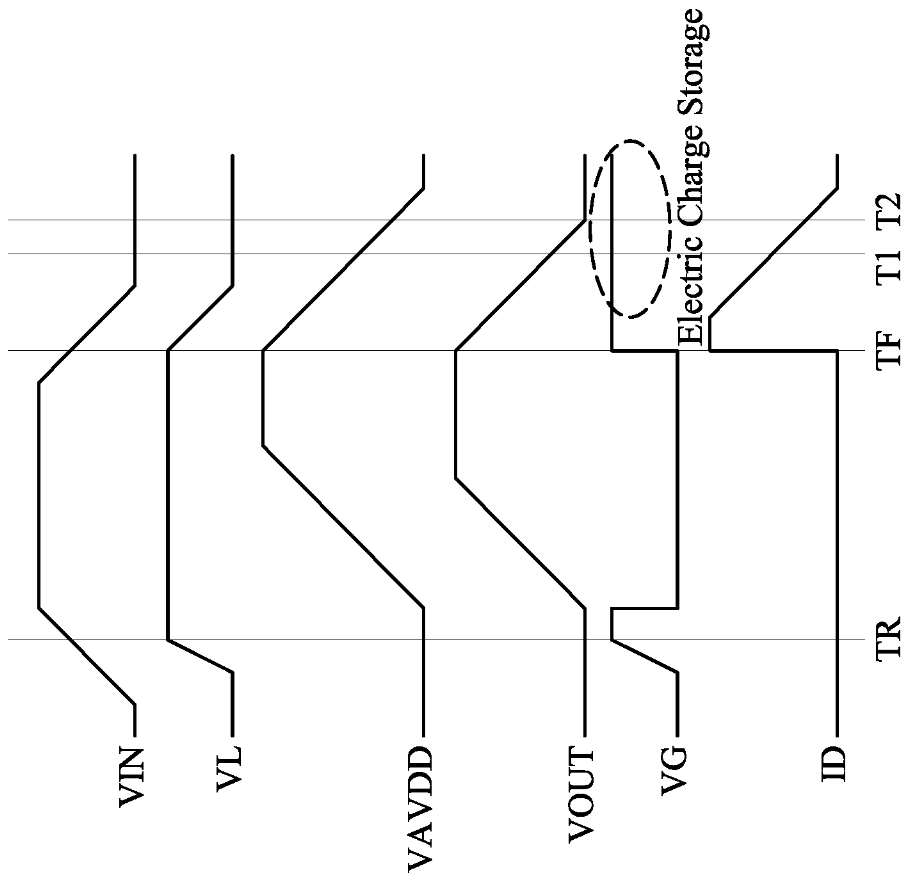
FIG. 2B shows timing diagrams of pertinent signals of the power amplifier of FIG. 2A.

FIG. 2A shows a block diagram illustrating a power amplifier 200 adaptable to power management integrated circuits according to one embodiment of the present invention, and FIG. 2B shows timing diagrams of pertinent signals of the power amplifier 200 of FIG. 2A.

According to one aspect of the embodiment, the discharge circuit 13 may further include a voltage tracking circuit 133 configured to track the input voltage VIN. The discharge circuit 13 may further include an electric charge storage circuit 134 being under control of the voltage tracking circuit 133 (and the logic controller 132), and configured to maintain the control voltage VG (at high voltage level) in order to continuously turn on the discharge transistor M3 when the input voltage VIN drops to the predetermined voltage level at the (input voltage VIN) falling trigger time (e.g., time TF shown in FIG. 2B).

Figure 3A:
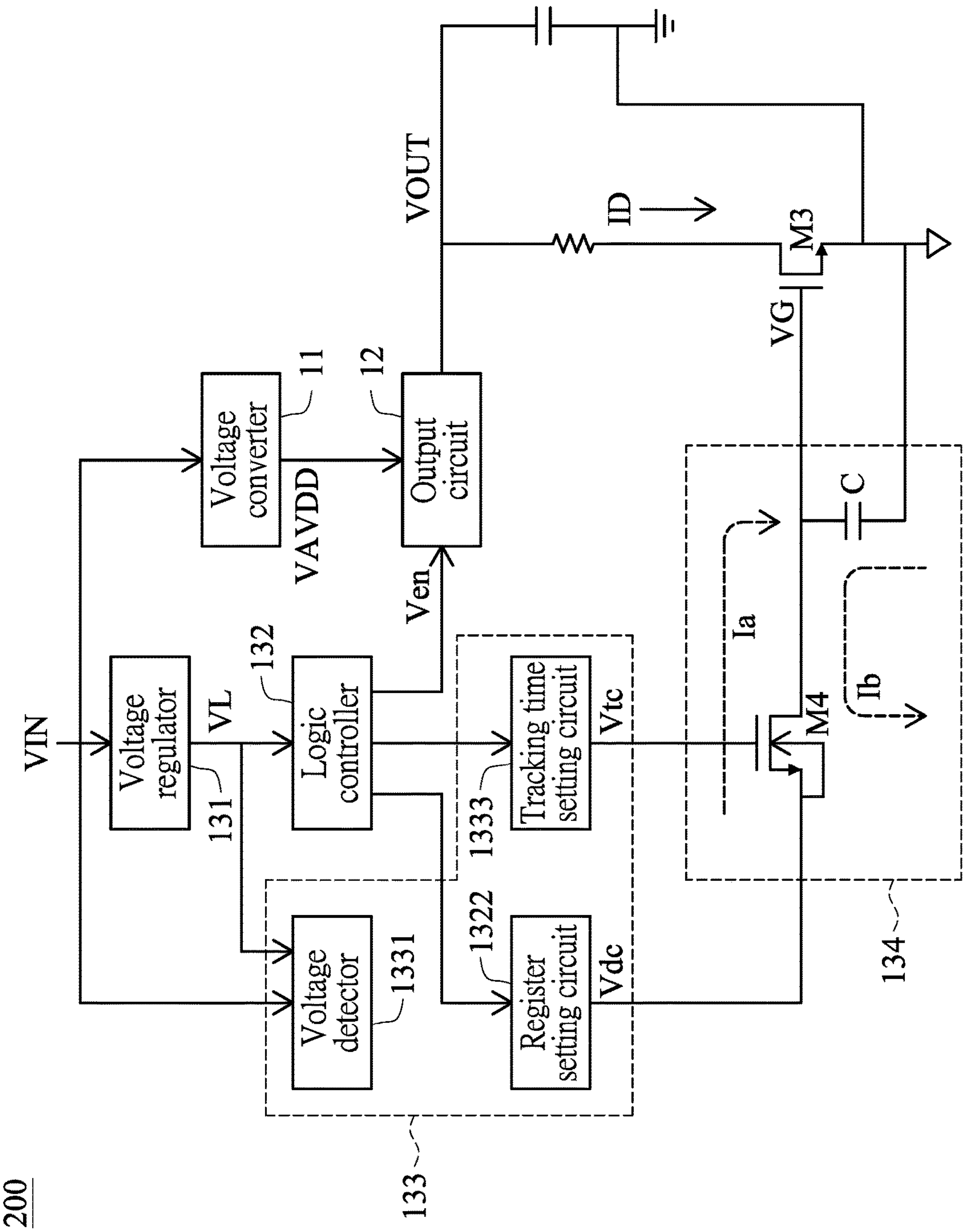
FIG. 3A shows a detailed block diagram of the power amplifier of FIG. 2A according to one embodiment of the present invention.
Figure 3B:
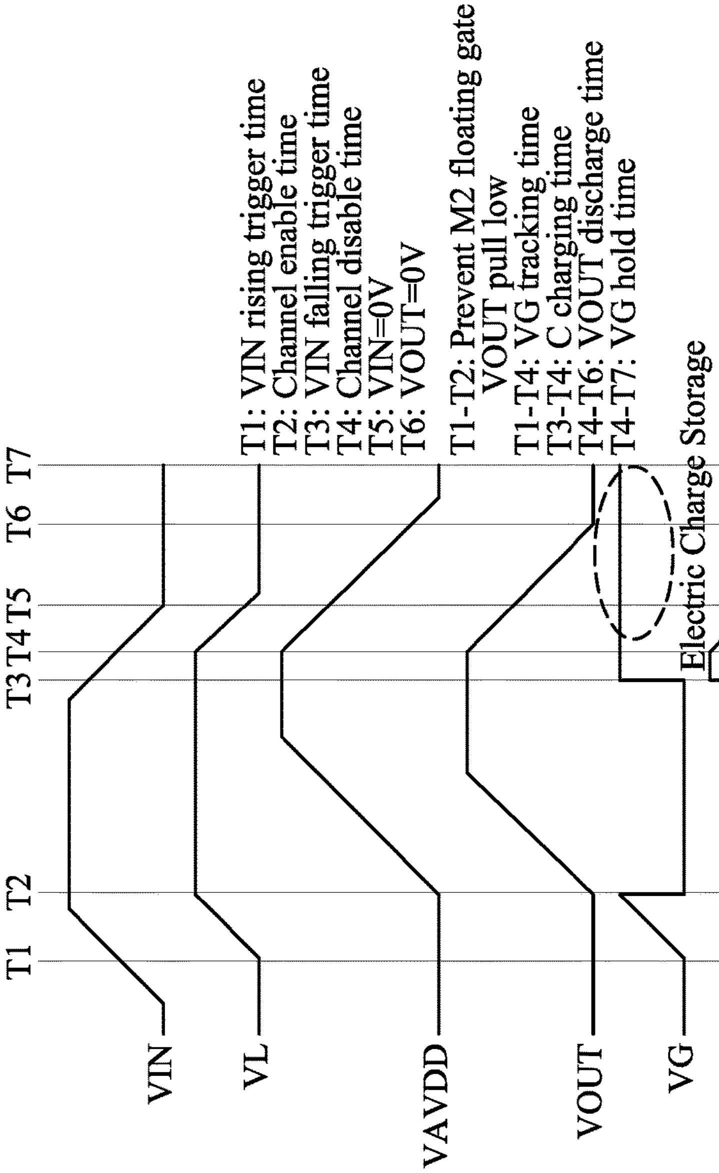
FIG. 3B shows timing diagrams of pertinent signals of the power amplifier of FIG. 3A.

FIG. 3A shows a detailed block diagram of the power amplifier 200 of FIG. 2A according to one embodiment of the present invention, and FIG. 3B shows timing diagrams of pertinent signals of the power amplifier 200 of FIG. 3A.

In the embodiment, the voltage tracking circuit 133 may include a voltage detector 1331 configured to detect the input voltage VIN and the regulated voltage VL. The voltage tracking circuit 133 may include a register setting circuit 1332 being under control of the logic controller 132 and configured to generate a first storage signal Vdc used to control the electric charge storage circuit 134. The voltage tracking circuit 133 may include a tracking time setting circuit 1333 being under control of the logic controller 132 and configured to generate a second storage signal Vtc used to control the electric charge storage circuit 134.

In the embodiment, the electric charge storage circuit 134 may include a storage transistor M4 coupled to receive the first storage signal Vdc (from the register setting circuit 1332) and the second storage signal Vtc (from the tracking time setting circuit 1333) and configured to generate the control voltage VG (to the discharge transistor M3). Specifically, the storage transistor M4 (e.g., n-type MOSFET) has a drain that provides the control voltage VG, a source coupled to receive the first storage signal Vdc, and a gate coupled to receive the second storage signal Vtc. The electric charge storage circuit 134 may include a capacitor C connected between a node that provides the control voltage VG and the earth.

In operation, when the input voltage VIN drops to the predetermined voltage level at the (input voltage VIN) falling trigger time T3, the first storage signal Vdc becomes active (e.g., high voltage) while the second storage signal Vtc remains active (e.g., high voltage) that turns on the storage transistor M4. Therefore, a current Ia charges the capacitor C. Subsequently, when the converted voltage VAVDD (and the regulated voltage VL) begin falling at T4 (also called channel disable time), the first storage signal Vdc changes from active (e.g., high voltage) to inactive (e.g., low voltage) and the second storage signal Vtc becomes inactive (e.g., low voltage) to turn off (or disable) the storage transistor M4. Therefore, a current Ib starts to discharge the capacitor C, and the output voltage VOUT begins discharge at the output node. In one exemplary embodiment, in order to maintain the control voltage VG before completing the discharge at the output node VOUT, the following conditions may be satisfied: discharge time $(C*VG)/Ib >> (CL*VOUT)/ID$, control voltage VG hold time $T4-T7=(C*VG)/Ib$, and output voltage VOUT discharge time $T4-T6=(CL*VOUT)/ID$.

Figure 4A:
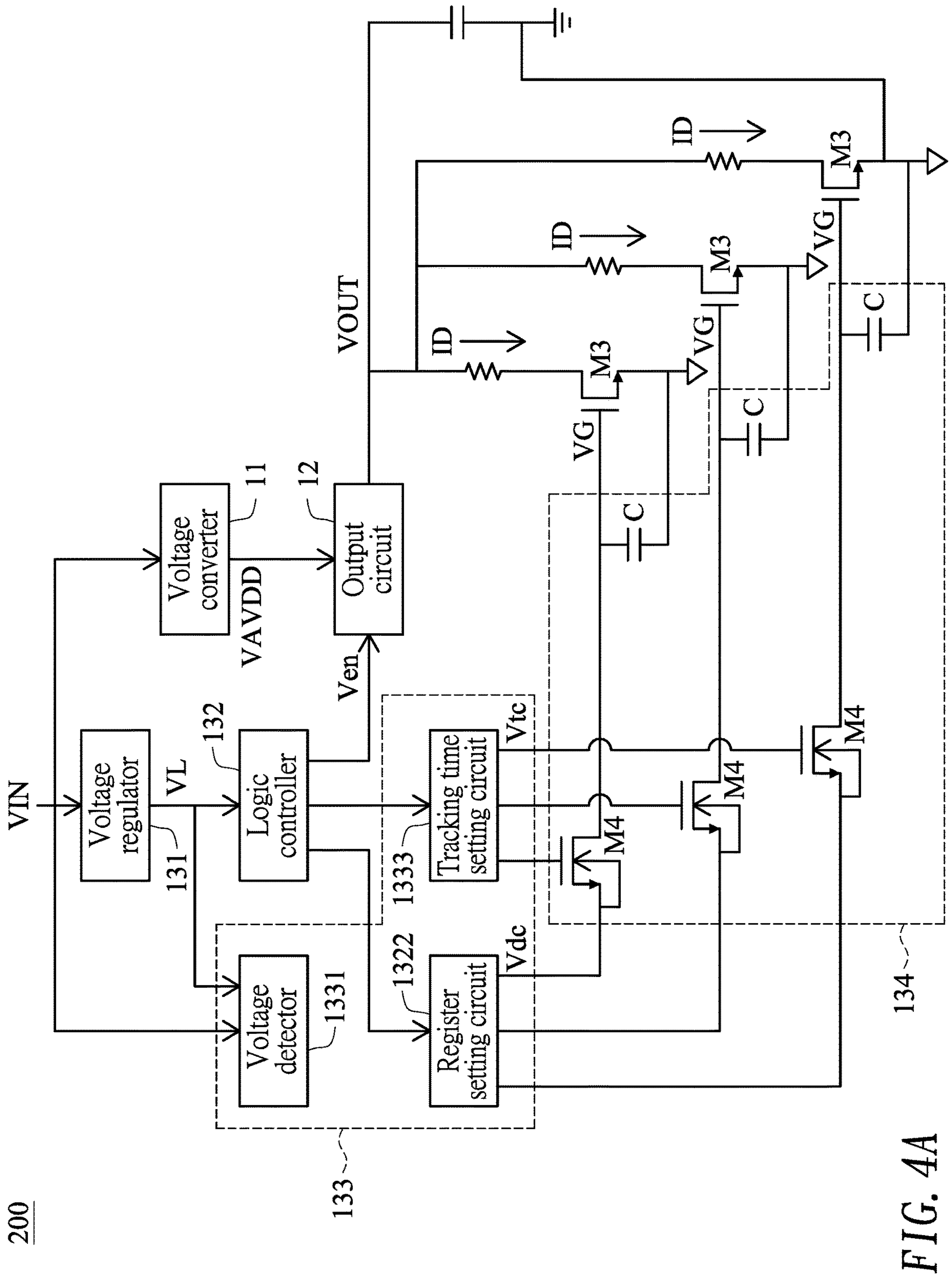
FIG. 4A shows a detailed block diagram of the power amplifier of FIG. 2A according to one embodiment of the present invention.
Figure 4B:
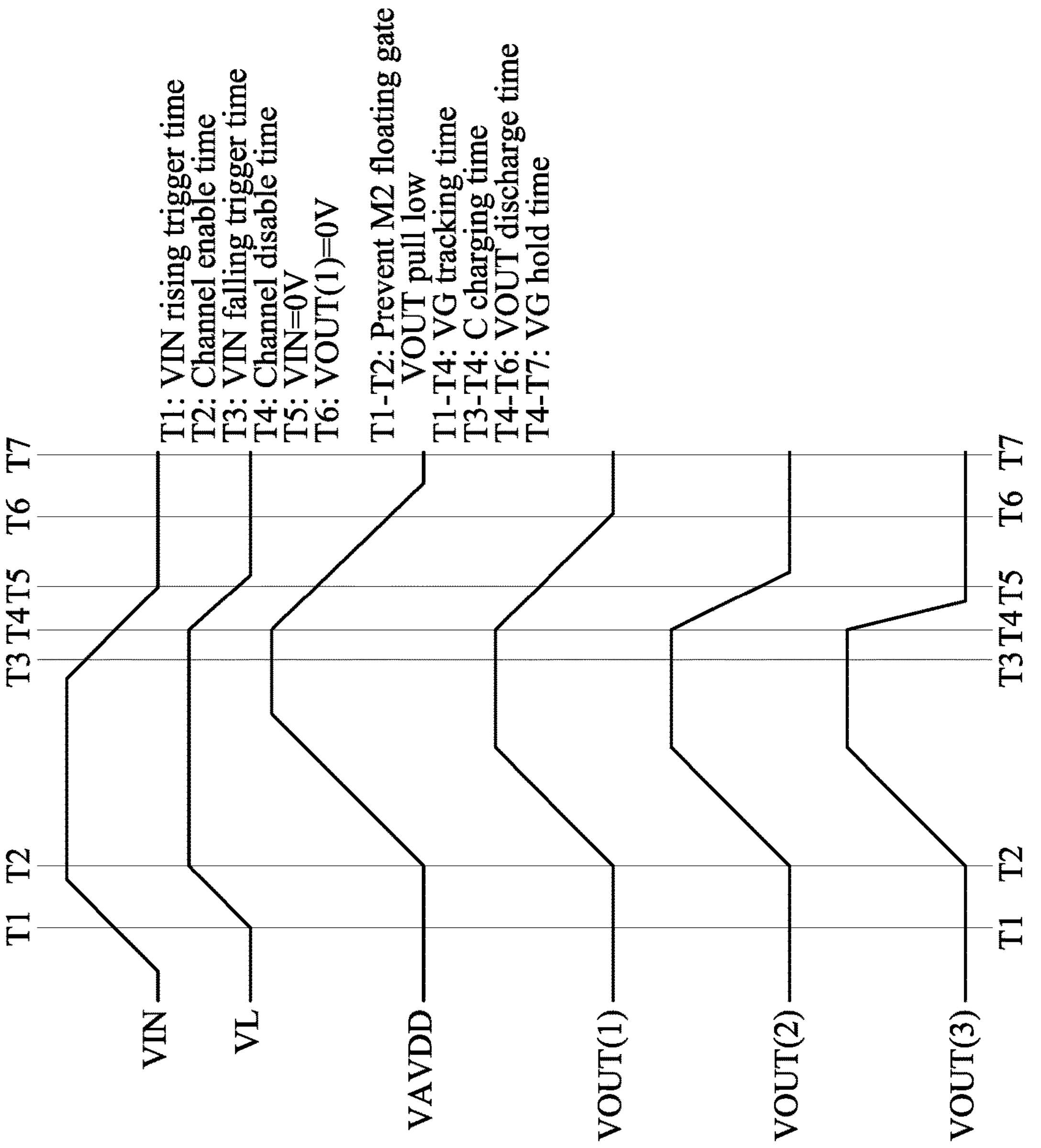
FIG. 4B shows timing diagrams of pertinent signals of the power amplifier of FIG. 4A.

FIG. 4A shows a detailed block diagram of the power amplifier 200 of FIG. 2A according to one embodiment of the present invention, and FIG. 4B shows timing diagrams of pertinent signals of the power amplifier 200 of FIG. 4A.

The power amplifier 200 of FIG. 4A is similar to the power amplifier 200 of FIG. 3A except that duplicate electric charge storage circuits 134 (and corresponding discharge transistors M3) are used in the present embodiment for corresponding channels respectively. As shown in FIG. 4B, the waveform VOUT(1) represents the use of one electric charge storage circuit 134, the waveform VOUT(2) represents the use of two electric charge storage circuits 134 with faster discharge, and the waveform VOUT(3) represents the use of three electric charge storage circuits 134 with even faster discharge.

Although specific embodiments have been illustrated and described, it will be appreciated by those skilled in the art that various modifications may be made without departing from the scope of the present invention, which is intended to be limited solely by the appended claims.

What is claimed is:

1. A power amplifier, comprising:

a voltage converter that converts an input voltage to a converted voltage;

an output circuit coupled to receive the converted voltage and configured to generate an output voltage at an output node;

a discharge transistor electrically connected between the output node and earth and configured to perform discharge at the output node under control of a control voltage;

a voltage tracking circuit that tracks the input voltage; and an electric charge storage circuit being under control of the voltage tracking circuit and configured to maintain the control voltage when the input voltage drops to a predetermined voltage level in order to continuously turn on the discharge transistor before completing discharge at the output node.

2. The power amplifier of claim 1, wherein the voltage converter comprises a boost converter.

3. The power amplifier of claim 1, wherein the output circuit comprises:

an output stage composed of a first transistor and a second transistor connected in series between the converted voltage and the earth, and interconnected at the output node, the second transistor having a type opposite to the first transistor; and a driver that controls the first transistor and the second transistor.

4. The power amplifier of claim 3, wherein the first transistor comprises a p-type metal-oxide-semiconductor field-effect transistor (MOSFET) and the second transistor comprises an n-type MOSFET, wherein the first transistor has a source coupled to receive the converted voltage, a drain connected to the output node, and a gate controlled by the driver; and the second transistor has a drain connected to the output node, a source connected to the earth, and a gate controlled by the driver.

5. The power amplifier of claim 1, further comprising:

a voltage regulator coupled to receive the input voltage and configured to generate a regulated voltage; and a logic controller coupled to receive the regulated voltage and configured to generate the control voltage used to control the discharge transistor.

6. The power amplifier of claim 5, wherein the voltage regulator comprises a low-dropout (LDO) regulator.

7. The power amplifier of claim 5, wherein the voltage tracking circuit comprises:

a voltage detector that detects the input voltage and the regulated voltage.

8. The power amplifier of claim 1, wherein the voltage tracking circuit comprises:

a register setting circuit that generates a first storage signal used to control the electric charge storage circuit; and a tracking time setting circuit that generates a second storage signal used to control the electric charge storage circuit.

9. The power amplifier of claim 8, wherein the electric charge storage circuit comprises:

a storage transistor coupled to receive the first storage signal and the second storage signal and configured to generate the control voltage; and a capacitor connected between a node that provides the control voltage and the earth.

10. The power amplifier of claim 9, wherein the storage transistor comprises an n-type MOSFET having a drain that provides the control voltage, a source coupled to receive the first storage signal, and a gate coupled to receive the second storage signal.

11. The power amplifier of claim 9, wherein when the input voltage drops to the predetermined voltage level, the first storage signal becomes active while the second storage signal remains active that turns on the storage transistor, thereby charging the capacitor.

12. The power amplifier of claim 11, wherein when the converted voltage begins falling, the first storage signal changes from active to inactive and the second storage signal becomes inactive to turn off the storage transistor, thereby discharging the capacitor and beginning discharge at the output node.

13. The power amplifier of claim 1, further comprising:

at least one duplicate electric charge storage circuit and corresponding discharge transistor.

14. The power amplifier of claim 1, wherein the discharge transistor comprises an n-type MOSFET having a drain electrically connected to the output node, a gate coupled to receive the control voltage, and a source electrically connected to the earth.

* * * * *